United States Patent
Varnica et al.

(10) Patent No.: US 8,937,778 B1
(45) Date of Patent: Jan. 20, 2015

(54) METHODS AND APPARATUS FOR PERFORMING TRACK-LEVEL BASED DATA CODING

(71) Applicant: Marvell International Ltd., Hamilton (BM)

(72) Inventors: Nedeljko Varnica, San Jose, CA (US); Gregory Burd, San Jose, CA (US); Panu Chaichanavong, Bangkok (TH)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 14/031,277

(22) Filed: Sep. 19, 2013

Related U.S. Application Data

(60) Provisional application No. 61/704,877, filed on Sep. 24, 2012.

(51) Int. Cl.
*G11B 5/09* (2006.01)
*G11B 20/10* (2006.01)

(52) U.S. Cl.
CPC .................................... *G11B 5/09* (2013.01)
USPC ................................................... 360/39

(58) Field of Classification Search
None
See application file for complete search history.

(56) References Cited

U.S. PATENT DOCUMENTS

| | | | |
|---|---|---|---|
| 2008/0244356 A1* | 10/2008 | Bliss et al. | 714/755 |
| 2012/0060073 A1* | 3/2012 | Itakura et al. | 714/758 |

\* cited by examiner

*Primary Examiner* — Regina N Holder

(57) ABSTRACT

Systems and methods for storing data on a storage device are disclosed. Data for storage to one of a plurality of tracks of the storage device is received. Each of the plurality of tracks includes a plurality of sectors. The received data is encoded using a track level code. The track level code encodes multiple of the plurality of sectors of the one of the plurality of tracks. The encoded data is stored to the one of the plurality of tracks of the storage device.

20 Claims, 2 Drawing Sheets

METHODS AND APPARATUS FOR PERFORMING TRACK-LEVEL BASED DATA CODING

CROSS REFERENCE TO RELATED APPLICATION

This disclosure claims the benefit of U.S. Provisional Application No. 61/704,877, filed Sep. 24, 2012, which is incorporated herein by reference in its entirety.

FIELD OF USE

The present disclosure relates generally to magnetic storage device systems and methods, and, more particularly, to storing information in a magnetic storage device using track level codes.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, is neither expressly nor impliedly admitted as prior art against the present disclosure.

Typical shingled magnetic recording (SMR) systems store data to a hard disk drive (HDD) in tracks that overlap and interfere with each other. Accordingly, in these systems data can be read from the HDD on a sector-by-sector basis but must be written to the HDD only on a track-by-track basis. That is, writing data to only a specific sector of a given track of the HDD requires rewriting the given track in its entirety. Moreover, the HDD controller in these SMR systems must write data sequentially one track after the other.

SUMMARY

Accordingly, the present disclosure relates to systems and methods for storing information in a magnetic storage device using track level codes. In some embodiments, data for storage to one of a plurality of tracks of the storage device is received. Each of the plurality of tracks includes a plurality of sectors. The received data is encoded using a track level code. The track level code encodes multiple of the plurality of sectors of the one of the plurality of tracks. The encoded data is stored to the one of the plurality of tracks of the storage device.

In some embodiments, the multiple of the plurality of sectors includes each of the plurality of sectors of the one of the plurality of tracks. In some embodiments, each of the plurality of sectors of the one of the plurality of tracks is encoded using a sector level code after encoding the received data using the track level code. In some embodiments, the data that is encoded using the track level code is encoded with a run-length limited (RLL) code prior to encoding each of the plurality of sectors of the one of the plurality of tracks. In some embodiments, multiple of the plurality of sectors of the one of the plurality of tracks includes a subset of the plurality of sectors that includes more than one of the plurality of sectors but less than all of the plurality of sectors.

BRIEF DESCRIPTION OF THE DRAWINGS

The details of one or more implementations are set forth in the accompanying drawings in the description below. Other features and various advantages will be more apparent upon consideration of the following detailed description, taken in conjunction with the accompanying drawings in which.

DETAILED DESCRIPTION

This disclosure generally relates to performing track level coding for non-volatile storage systems, and, more particularly, to encoding data using a track level code for storage in the non-volatile storage device. For illustrative purposes, this disclosure is described in the context of a magnetic storage device (e.g., SMR media storage device). It should be understood, however, that this disclosure is applicable to any other type of non-volatile storage device where data is stored in blocks of data (e.g. tracks or other forms of data blocks) that have multiple sectors (e.g., a magnetic storage device, magneto-resistive random access memory (MRAM), optical storage device, magneto-optical storage device, analog storage device, domain propagation storage device, and a holographic storage device). For illustrative purposes, this disclosure is described in the context of encoding data for storage on a non-volatile storage device or writing to a non-volatile storage device. It should be understood, however, that this disclosure is applicable to decoding data stored in accordance with this disclosure by performing the reading/decoding operations to recover the written data. Specifically, to read data stored in accordance with the present disclosure, decoding operations may be used to decode the data encoded with the encoding operations that are described.

Figure 1:
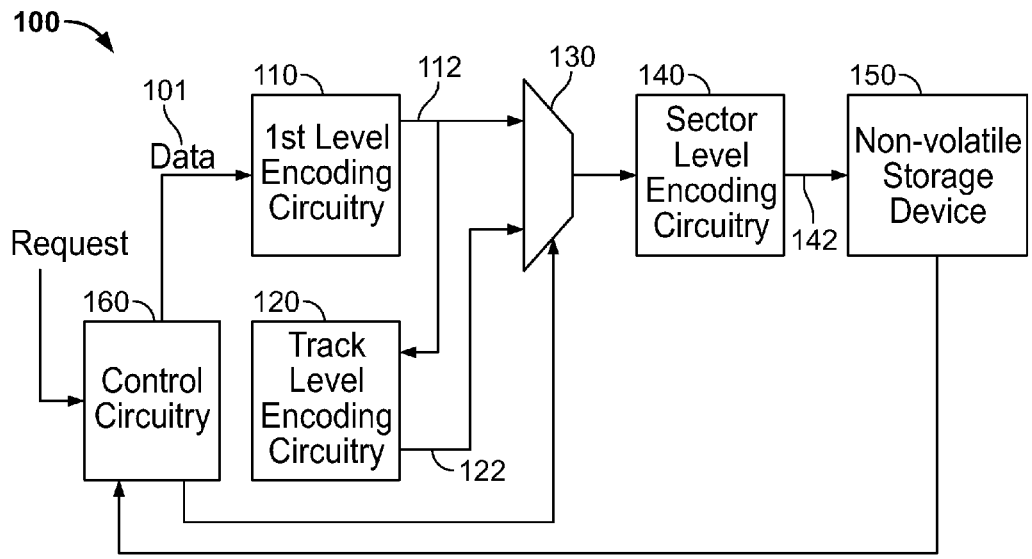
FIGS. 1-3 are diagrams of illustrative track level coding non-volatile storage systems in accordance with embodiments of the present disclosure.

FIG. 1 is a diagram of an illustrative track level coding non-volatile storage system 100 in accordance with an embodiment of the present disclosure. Specifically, in typical non-SMR systems, error correction coding (ECC) is done on a logical sector level, e.g. 0.5 KB or 4 KB chunks of user data. This ECC can be referred to as sector ECC. As discussed herein, in SMR, according to embodiments adding ECC on a track level allows users to enhance data reliability. For example, if one sector from a track fails (sector ECC fails), it can be recovered with the help of track ECC. System 100 includes first level encoding circuitry 110, track level encoding circuitry 120, selection circuitry 130, sector level encoding circuitry 140, control circuitry 160, and a non-volatile storage device 150. Non-volatile storage device 150 may be a magnetic storage device, such as an SMR media device. Non-volatile storage device 150 may store data in tracks where each track has multiple sectors. The tracks of device 150 may partially overlap and interfere with each other. In some implementations, additional encoding and/or decoding circuitry may be used to address errors that arise due to the spacing or pitch (the partial overlap) between the tracks. Systems and methods for reading and writing data to non-volatile storage device 150 in a shingled manner are discussed in more detail in: Gregory Burd U.S. patent application Ser. No. 13/082, 018, filed Apr. 7, 2011; Burd et al. U.S. patent application Ser. No. 13/050,315, filed Mar. 17, 2011; Gregory Burd et al. U.S. patent application Ser. No. 13/372,759, filed Feb. 14, 2012; and Burd et al. U.S. patent application Ser. No. 13/413,049, filed Mar. 6, 2012, each of which is hereby incorporated by reference herein in its entirety.

Although sector level encoding circuitry 140 is shown in system 100, in some implementations, circuitry 140 may be omitted such that the output of selection circuitry 130 is directly stored to non-volatile storage device 150.

In some embodiments, user data may be received from another component in the system by control circuitry 160. For example, user data may be received from a volatile (e.g., a double data rate (DDR) memory) or non-volatile storage device. User data may be received by control circuitry 160 as a request to perform a write or store operation to a given sector of a given track of storage device 150. In order to write the data to the sector of the track of storage device 150, control circuitry 160 may need to rewrite the entire track that includes the corresponding sector. Accordingly, in some implementations, control circuitry 160 may retrieve the entire track (e.g., every sector on the associated track) from storage device 150 in response to a request to write or store data to one or more sectors of the track. The data from the entire track that is retrieved may be processed by control circuitry 160 to replace the given sector of the retrieved track with the sector data in the request. After the sector is replaced, the revised track information is provided by control circuitry 160 as data 101 to first level encoding circuitry 110 to be rewritten to storage device 150.

Data 101 may be provided to first level encoding circuitry 110. First level encoding circuitry 110 may encode data 101 using any type of error detection or correction code, such as a cyclic redundancy code. In some implementations, first level encoding circuitry 110 may include multiple sequential or parallel encoding circuitries.

The output 112 of first level encoding circuitry 110 may be provided to track level encoding circuitry 120 and selection circuitry 130. Track level encoding circuitry 120 may encode the output 112 using a track level code. Encoding and decoding operations performed by track level encoding circuitry 120 are discussed in more detail in Varnica et al. U.S. patent application Ser. No. 14/031,622, filed Sep. 19, 2013, entitled "SYSTEMS AND METHODS FOR CONFIGURING PRODUCT CODES FOR ERROR CORRECTION IN A HARD DISK DRIVE" and Varnica et al. U.S. patent application Ser. No. 14/031,527, filed Sep. 19, 2013, entitled "SYSTEMS AND METHODS FOR JOINT DECODING OF SECTOR AND TRACK ERROR CORRECTION CODES", each of which is hereby incorporated by reference herein in its entirety.

In some implementations, track level encoding circuitry 120 may encode the track in its entirety. For example, track level encoding circuitry 120 may generate parity information based on information stored in every sector of a given track. In some implementations, track level encoding circuitry 120 may encode only a predetermined portion or subset of the sectors of a track. For example, track level encoding circuitry 120 may generate parity information based on information stored in more than one sector of a given track but less than all of the sectors of the given track. Performing track level coding differs from sector level coding in that sector level coding encodes data within a given sector. Track level coding encodes data across multiple sectors. In some implementations, the track level codes may encode the parity information associated with a given sector. Track level encoding circuitry 120 may generate output 122. Output 122 of track level encoding circuitry 120 may be provided to selection circuitry 130. Output 122 may include parity information for a given subset or portion of a given track or every sector in a given track.

As referred to herein, the phrase "track level" coding means performing an encoding or decoding operation (encoding or decoding data) across multiple sectors of a given track to generate parity information for a combination of sectors of a given track. As referred to herein, the phrase "sector level" coding means performing an encoding or decoding operation (encoding or decoding data) on a sector-by-sector basis of a given track to generate parity information for a specific track being encoded/decoded.

In some embodiments, selection circuitry 130 may be a multiplexor. Selection circuitry 130 may be instructed by control circuitry 160 to select between output 112 of first level encoding circuitry 110 and output 122 of track level encoding circuitry 120 for output to sector level encoding circuitry 140. In some implementations, selection circuitry 130 may be instructed by control circuitry 160 to switch between output 112 and output 122 based on a predetermined number of bits or sectors that have been processed by sector level encoding circuitry 140. Specifically, in some implementations, selection circuitry 130 may be instructed by control circuitry 160 to select as output a first portion of the track level parity information in output 122. After the received first portion is processed by sector level encoding circuitry 140, selection circuitry 130 may switch to select as output a first portion of first level encoded data from output 112. After the first portion of first level encoded data is processed by sector level encoding circuitry 140, selection circuitry 130 may switch back to select, as its output, output 122 to have a second portion of the track level parity information in output 122 processed. Selection circuitry 130 may continue to be instructed to switch between output 112 and output 122 in this manner until each portion of track level parity information in output 122 and each portion of first level encoded data is processed by sector level encoding circuitry 140. Selection circuitry 130 may be instructed to perform the switching operations to interweave track level parity information between sector level parity information and/or to interweave sector level parity information or track level parity information between user data.

Sector level encoding circuitry 140 may receive the output of selection circuitry 130. Sector level encoding circuitry 140 may include one level or multiple levels of encoding. After sector level encoding circuitry 130 encodes the data (corresponding to a complete track of device 150) received from selection circuitry 130, the output 142 of sector level encoding circuitry 130 is stored or recorded on non-volatile storage device 150 as a given track. In some implementations, sector level encoding circuitry 140 may be replaced with a buffer that receives the output of selection circuitry 130. In such cases, the buffer may have a size corresponding to a size of the sector or track of storage device 150. After the buffer reaches its capacity and receives data from selection circuitry 130 corresponding to an entire track, the output of the buffer is written to the corresponding track of storage device 150.

In some embodiments, run-length limited (RLL) code encoder circuitry may be included in system 100. Data 101 may be encoded with the RLL code encoder circuitry after being encoded by track level encoding circuitry 120 or before being encoded by track level circuitry 120.

In some embodiments, to decode data stored on non-volatile storage device 150, the encoding operations may be performed in reverse order. For example, control circuitry 160 may read data from non-volatile storage device 150. The read data may include the track level parity information and/or sector level parity information. Control circuitry 160 may provide the read data to sector level decoding circuitry (not shown). The sector level decoding circuitry may include the same or similar components as sector level encoding circuitry 140. The operation of the decoding circuitry may need to assist in achieving recovery of the original user data from the read data. Sector level decoding circuitry may use the sector level parity information to decode the read data and identify and/or correct errors encountered in the read data. Following the sector level decoding, the read sector-level decoded data may be input to track level decoding circuitry along with any track level parity information that has been read. Track level decoding circuitry may include the same or similar circuitry as track level encoding circuitry 120. The operation of the decoding circuitry may need to assist in achieving recovery of the original user data from the read data. Track level decoding circuitry may use the track level parity information to decode the combination of sectors associated with the read data and identify and/or correct errors encountered in the combination of sectors of the read data. In some implementations, when the combination of sectors includes all the sectors of the read track, the track level decoding circuitry may use the track level parity information to decode all of the sectors in the read track and identify and/or correct errors encountered in the track. The sector level and track level decoded data may be supplied to first level decoding circuitry which processes received data and decodes it in the fashion corresponding to the first level encoding circuitry 110 for output as read decoded data to another system component (e.g., DRAM).

Figure 2:
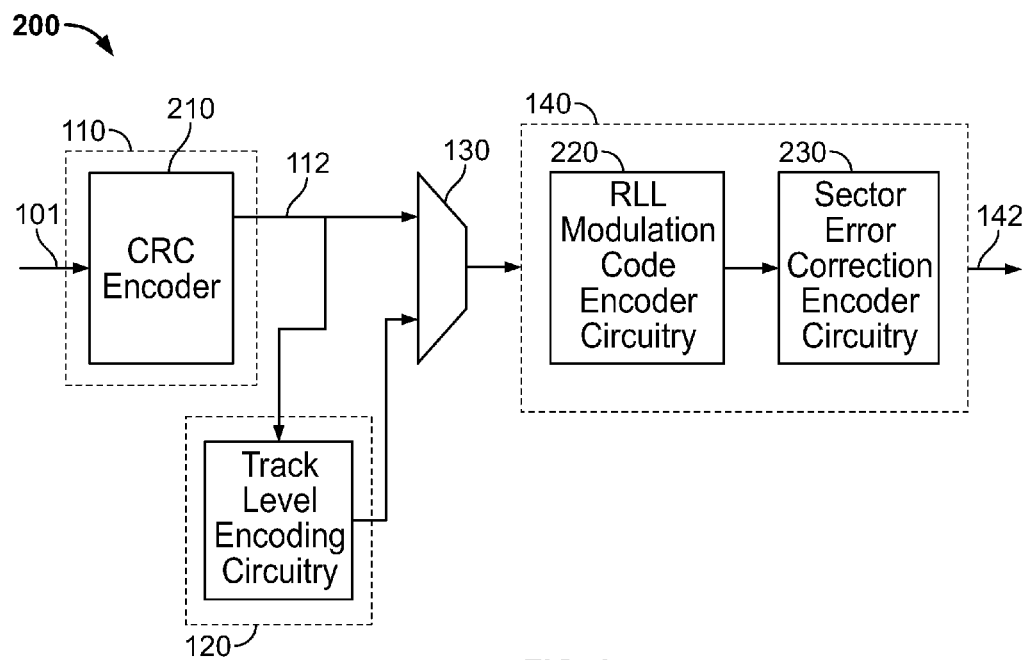

FIG. 2 is a diagram of an illustrative track level coding non-volatile storage system 200 in accordance with an embodiment of the present disclosure. System 200 is similar to system 100 but includes RLL code encoder circuitry following track level encoding circuitry 120. Specifically, system 200 may include a cyclic redundancy code (CRC) encoder 210 as part of first level encoding circuitry 110 and RLL modulation code encoder circuitry 220 as part of sector level encoding circuitry 140.

In system 200, after data is encoded by CRC encoder 210, the output is provided to selection circuitry 130 and to track level encoding circuitry 120. Control circuitry 160 may instruct selection circuitry 130 to operate in a similar manner as discussed in connection with FIG. 1. The output of selection circuitry 130 is provided to RLL modulation code encoder circuitry 220. After the track level encoded data is processed by RLL modulation code encoder circuitry 220, the data is further processed by sector error correction code encoder circuitry 230 before being written to storage device 150.

Figure 3:
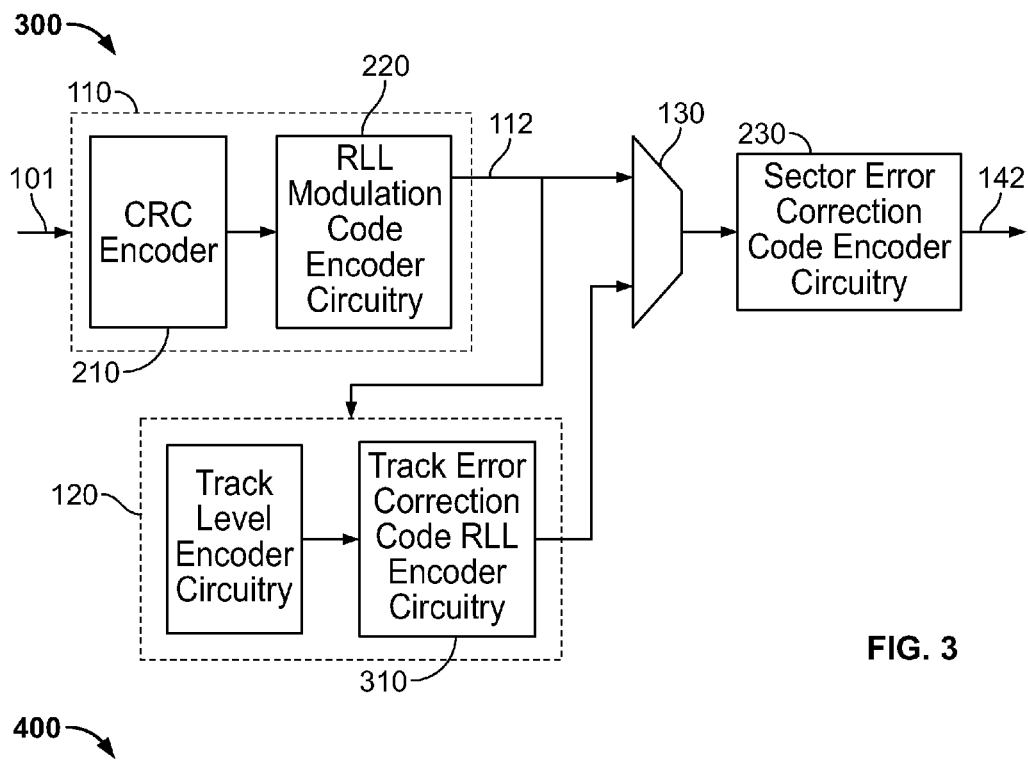

FIG. 3 is a diagram of an illustrative track level coding non-volatile storage system 300 in accordance with an embodiment of the present disclosure. System 300 is similar to system 100 but includes RLL code encoder circuitry before track level encoding circuitry 120. Specifically, system 300 may include cyclic redundancy code (CRC) encoder 210 and RLL modulation code, encoder circuitry 220 as part of first level encoding circuitry 110. In system 300, where data 101 is processed by RLL code encoder circuitry before being processed by track level encoding circuitry 120, track level encoder circuitry 120 may include a track error correction code RLL encoder circuitry 310 that follows track level encoder circuitry. In particular, after the RLL encoded data is encoded by track level encoder circuitry (which encodes the data as discussed above), the track level encoded data is further encoded by track error correction code RLL encoder circuitry 310. The output of track error correction code RLL encoder circuitry 310 is then provided to selection circuitry 130 to be provided to sector error correction code encoder circuitry 230 to ultimately be written to storage device 150.

When data is encoded in the manner discussed with respect to system 300, the data may be decoded in accordance with joint sector error correction code/track error correction code techniques. RLL modulation code encoder circuitry 220 when used in the context of system 300 may encode data using an RLL code that has little or no error propagation.

Figure 4:
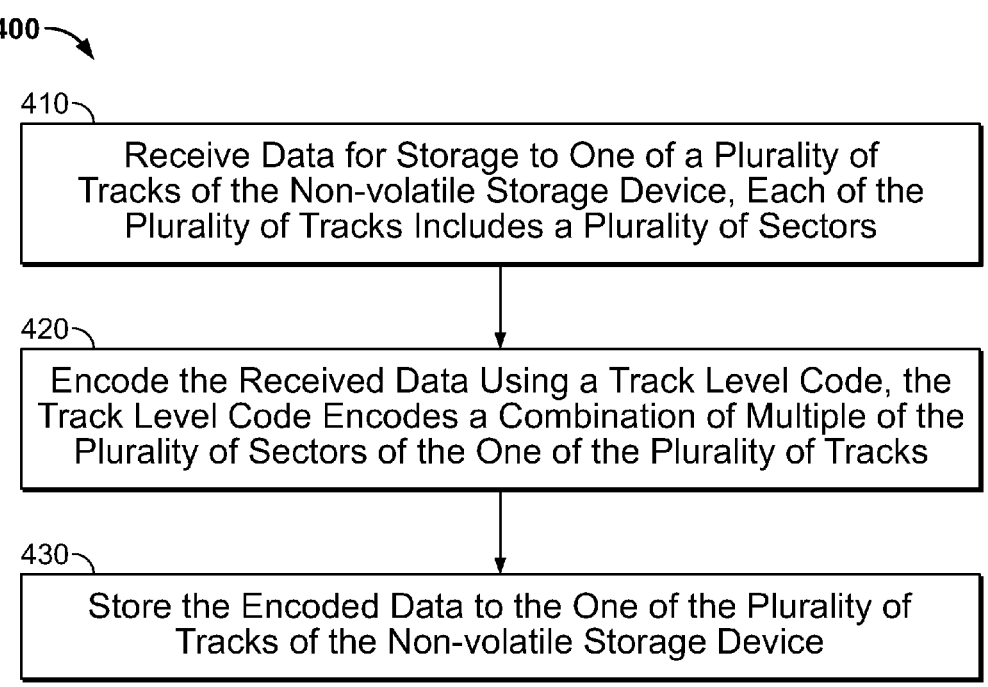
FIG. 4 illustrates a process for performing track level coding for non-volatile storage systems in accordance with an embodiment of the present disclosure.

FIG. 4 illustrates a process 400 for performing track level coding for non-volatile storage systems in accordance with an embodiment of the present disclosure. At 410, data for storage to one of a plurality of tracks of the non-volatile storage device is received. Each of the plurality of tracks includes a plurality of sectors. For example, data 101 may be received for storage to storage device 150.

At 420, the received data is encoded using a track level code that encodes a combination of multiple sectors of the plurality of sectors of the one of the plurality of tracks. For example, data 101 may be encoded by track level encoding circuitry 120. In some implementations, data 101 may be encoded by track level encoding circuitry 120 after being encoded by first level encoding circuitry 110 (e.g., a CRC encoder).

At 430, the encoded data is stored to the one of the plurality of tracks of the non-volatile storage device. For example, the encoded data output by track level encoding circuitry 120 may be passed through selection circuitry 130 to ultimately be stored to storage device 150.

The foregoing describes methods and apparatus for performing track-level based data coding for storing data to a non-volatile storage device (e.g., an SMR media device). The above-described embodiments of the present disclosure are presented for the purposes of illustration and not of limitation. Furthermore, the present disclosure is not limited to a particular implementation. For example, one or more steps of methods described above may be performed in a different order (or concurrently) and still achieve desirable results. In addition, the disclosure may be implemented in hardware, such as on an application-specific integrated circuit (ASIC) or on a field-programmable gate array (FPGA). The disclosure may also be implemented in software.

What is claimed is:

1. A method for storing data on a storage device, the method comprising:
   receiving data for storage to one of a plurality of tracks of the storage device, wherein each of the plurality of tracks includes a plurality of sectors;
   encoding the received data using a track level code to generate first encoded data, wherein the track level code encodes multiple of the plurality of sectors of the one of the plurality of tracks;
   encoding the first encoded data using a sector level code to generate second encoded data; and
   storing the second encoded data to the one of the plurality of tracks of the storage device.

2. The method of claim 1, wherein the storage device is a magnetic storage device or a non-volatile memory.

3. The method of claim 1, wherein the second encoded data is stored to the one of the plurality of tracks using a shingled magnetic recording technique.

4. The method of claim 1 further comprising rewriting a given one of the plurality of tracks in its entirety in response to receiving a request to store data to less than all of the plurality of sectors of the given one of the plurality of tracks.

5. The method of claim 1, wherein the multiple of the plurality of sectors includes each of the plurality of sectors of the one of the plurality of tracks.

6. The method of claim 1 further comprising encoding each of the plurality of sectors of the one of the plurality of tracks using the sector level code after encoding the received data using the track level code.

7. The method of claim 6 further comprising encoding the data that is encoded using the track level code with a run-length limited (RLL) code prior to encoding each of the plurality of sectors of the one of the plurality of tracks.

8. The method of claim 7, wherein the RLL code corresponds to a code associated with a defined error propagation.

9. The method of claim 1 further comprising selectively providing the received data and the first encoded data to a sector level based encoder.

10. The method of claim 1, wherein the multiple of the plurality of sectors of the one of the plurality of tracks includes a subset of the plurality of sectors, wherein the subset includes more than one of the plurality of sectors but less than all of the plurality of sectors.

11. A system for storing data on a storage device, the system comprising:
   circuitry configured to:
      receive data for storage to one of a plurality of tracks of the storage device, wherein each of the plurality of tracks includes a plurality of sectors;
      encode the received data using a track level code to generate first encoded data, wherein the track level code encodes multiple of the plurality of sectors of the one of the plurality of tracks;
      encode the first encoded data using a sector level code to generate second encoded data; and
      store the second encoded data to the one of the plurality of tracks of the storage device.

12. The system of claim 11, wherein the storage device is a magnetic storage device or a non-volatile memory.

13. The system of claim 11, wherein the second encoded data is stored to the one of the plurality of tracks using a shingled magnetic recording technique.

14. The system of claim 11, wherein the circuitry is further configured to rewrite a given one of the plurality of tracks in its entirety in response to receiving a request to store data to less than all of the plurality of sectors of the given one of the plurality of tracks.

15. The system of claim 11, wherein the multiple of the plurality of sectors includes each of the plurality of sectors of the one of the plurality of tracks.

16. The system of claim 11, wherein the circuitry is further configured to encode each of the plurality of sectors of the one of the plurality of tracks using the sector level code after encoding the received data using the track level code.

17. The system of claim 16, wherein the circuitry is further configured to encode the data that is encoded using the track level code with a run-length limited (RLL) code prior to encoding each of the plurality of sectors of the one of the plurality of tracks.

18. The system of claim 17, wherein the RLL code corresponds to a code associated with a defined error propagation.

19. The system of claim 11, wherein the circuitry is further configured to selectively provide the received data and the first encoded data to a sector level based encoder.

20. The system of claim 11, wherein the multiple of the plurality of sectors of the one of the plurality of tracks includes a subset of the plurality of sectors, wherein the subset includes more than one of the plurality of sectors but less than all of the plurality of sectors.

* * * * *